(12) United States Patent
Goh et al.

(10) Patent No.: US 8,884,422 B2
(45) Date of Patent: Nov. 11, 2014

(54) FLIP-CHIP FAN-OUT WAFER LEVEL PACKAGE FOR PACKAGE-ON-PACKAGE APPLICATIONS, AND METHOD OF MANUFACTURE

(75) Inventors: Kim-Yong Goh, Singapore (SG); Jing-En Luan, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 616 days.

(21) Appl. No.: 12/651,365

(22) Filed: Dec. 31, 2009

(65) Prior Publication Data

US 2011/0156250 A1    Jun. 30, 2011

(51) Int. Cl.
| | |
|---|---|
| *H01L 23/02* | (2006.01) |
| *H01L 23/48* | (2006.01) |
| *H01L 23/52* | (2006.01) |
| *H01L 23/04* | (2006.01) |
| *H01L 29/40* | (2006.01) |
| *H01L 25/10* | (2006.01) |
| *H01L 23/498* | (2006.01) |
| *H01L 21/56* | (2006.01) |
| *H01L 25/16* | (2006.01) |
| *H01L 23/538* | (2006.01) |
| *H01L 23/00* | (2006.01) |

(52) U.S. Cl.
CPC ..... *H01L 21/565* (2013.01); *H01L 2221/68377* (2013.01); *H01L 2225/1058* (2013.01); *H01L 24/16* (2013.01); *H01L 2224/81001* (2013.01); *H01L 24/96* (2013.01); *H01L 2224/04105* (2013.01); *H01L 2224/81801* (2013.01);
(Continued)

(58) Field of Classification Search
None
See application file for complete search history.

(56) References Cited

U.S. PATENT DOCUMENTS

| | | |
|---|---|---|
| 4,074,342 A | 2/1978 | Honn et al. |
| 4,603,374 A | 7/1986 | Wasielewski |

(Continued)

OTHER PUBLICATIONS

Kim-Yong Goh, "Multi-Stacked Semiconductor Dice Scale Package Structure and Method of Manufacturing Same," U.S. Appl. No. 12/651,080, filed Dec. 31, 2009, 38 pages.

(Continued)

*Primary Examiner* — Hoang-Quan Ho
(74) *Attorney, Agent, or Firm* — Seed IP Law Group PLLC (57) ABSTRACT

A flip-chip fan-out wafer level package for package-on-package applications includes a semiconductor die with solder bumps on an upper surface in a flip chip configuration. The die is inverted, with an upper surface facing an upper side of a redistribution layer, with the solder bumps in electrical contact with respective chip contact pads of the redistribution layer. The redistribution layer includes conductive traces that place each of the solder bumps in electrical contact with one or both of one of a plurality of upper redistribution contact pads and one of a plurality of lower redistribution contact pads. Each of the plurality of upper redistribution contact pads has an upper solder ball in electrical contact therewith. The die and the upper solder balls are at least partially encapsulated in a layer of mold compound positioned on the upper surface of the redistribution layer, and whose lateral dimensions are defined by the lateral dimensions of the redistribution layer. The layer of mold compound has a back-ground surface at which a portion of each of the upper solder balls is exposed, for electrical contact with an upper package. Each of the lower redistribution contact pads has a lower solder ball a coupled thereto.

8 Claims, 6 Drawing Sheets

(52) U.S. Cl.
CPC .......... *H01L 2924/01033* (2013.01); *H01L 2224/16225* (2013.01); *H01L 2924/014* (2013.01); *H01L 2924/3511* (2013.01); H01L 24/81 (2013.01); H01L 25/105 (2013.01); H01L 23/49827 (2013.01); H01L 24/97 (2013.01); *H01L 2224/97* (2013.01); *H01L 2225/1052* (2013.01); *H01L 2924/01019* (2013.01); H01L 25/16 (2013.01); H01L 24/19 (2013.01); *H01L 2225/107* (2013.01); H01L 23/5389 (2013.01); *H01L 2924/18161* (2013.01); *H01L 2224/20* (2013.01); *H01L 2221/68345* (2013.01)
USPC ........... 257/690; 257/686; 257/698; 257/738; 257/778; 257/787; 257/E23.021; 257/E23.069; 257/E23.125; 257/E23.178

(56) References Cited

U.S. PATENT DOCUMENTS

| | | | |
|---|---|---|---|
| 4,715,115 A | 12/1987 | King et al. | |
| 5,222,014 A * | 6/1993 | Lin | 361/792 |
| 5,309,011 A | 5/1994 | Tazunoki et al. | |
| 5,355,580 A | 10/1994 | Tsukada | 29/840 |
| 5,488,200 A | 1/1996 | Tsukada | 174/261 |
| 5,936,843 A * | 8/1999 | Ohshima et al. | 361/760 |
| 6,188,127 B1 * | 2/2001 | Senba et al. | 257/686 |
| 6,253,992 B1 | 7/2001 | Fjelstad | 228/245 |
| 6,271,469 B1 | 8/2001 | Ma et al. | |
| 6,344,682 B1 * | 2/2002 | Tomita | 257/686 |
| 6,350,668 B1 | 2/2002 | Chakravorty | 438/612 |
| 6,680,529 B2 * | 1/2004 | Chen et al. | 257/700 |
| 6,717,245 B1 | 4/2004 | Kinsman et al. | 257/678 |
| 6,815,254 B2 | 11/2004 | Mistry et al. | |
| 6,828,665 B2 * | 12/2004 | Pu et al. | 257/686 |
| 6,882,054 B2 | 4/2005 | Jobetto | |
| 6,940,169 B2 | 9/2005 | Jin et al. | 257/738 |
| 7,045,899 B2 | 5/2006 | Yamane et al. | |
| 7,067,911 B1 * | 6/2006 | Lin et al. | 257/686 |
| 7,122,748 B2 * | 10/2006 | Yamada | 174/521 |
| 7,141,873 B2 * | 11/2006 | Aoyagi | 257/686 |
| 7,193,301 B2 | 3/2007 | Yamaguchi | |
| 7,247,947 B2 | 7/2007 | Wakabayashi et al. | |
| 7,388,293 B2 * | 6/2008 | Fukase et al. | 257/774 |
| 7,489,032 B2 | 2/2009 | Jobetto | |
| 7,642,128 B1 * | 1/2010 | Lin et al. | 438/106 |
| 7,714,453 B2 * | 5/2010 | Khan et al. | 257/787 |
| 7,772,687 B2 * | 8/2010 | Inoue | 257/686 |
| 7,825,520 B1 | 11/2010 | Longo et al. | |
| 7,871,861 B2 * | 1/2011 | Song et al. | 438/122 |
| 7,910,405 B2 | 3/2011 | Okada et al. | |
| 7,989,707 B2 * | 8/2011 | Yamano et al. | 174/260 |
| 8,003,496 B2 | 8/2011 | Oh et al. | |
| 8,004,074 B2 * | 8/2011 | Mori et al. | 257/686 |
| 8,004,092 B2 | 8/2011 | Lin et al. | |
| 8,035,213 B2 | 10/2011 | Lee et al. | |
| 8,089,777 B2 | 1/2012 | Negishi | |
| 8,105,915 B2 | 1/2012 | Camacho et al. | |
| 8,106,495 B2 * | 1/2012 | Kajiki | 257/678 |
| 8,125,066 B1 * | 2/2012 | Kang | 257/686 |
| 8,158,888 B2 * | 4/2012 | Shen et al. | 174/260 |
| 8,159,070 B2 | 4/2012 | Lin et al. | |
| 8,610,268 B2 | 12/2013 | Kobayashi et al. | |
| 2001/0026010 A1 * | 10/2001 | Horiuchi et al. | 257/678 |
| 2002/0070443 A1 | 6/2002 | Mu et al. | |
| 2004/0033643 A1 | 2/2004 | Odegard et al. | |
| 2004/0075164 A1 * | 4/2004 | Pu et al. | 257/686 |
| 2005/0041134 A1 | 2/2005 | Takayama | |
| 2005/0098891 A1 | 5/2005 | Wakabayashi et al. | |
| 2005/0121764 A1 * | 6/2005 | Mallik et al. | 257/686 |
| 2005/0146051 A1 | 7/2005 | Jobetto | |
| 2005/0161823 A1 | 7/2005 | Jobetto et al. | |
| 2005/0242422 A1 | 11/2005 | Klein et al. | |
| 2006/0091521 A1 | 5/2006 | Cady et al. | |
| 2006/0163715 A1 * | 7/2006 | Pendse | 257/691 |
| 2006/0256222 A1 | 11/2006 | Tsai | |
| 2007/0090508 A1 * | 4/2007 | Lin et al. | 257/686 |
| 2007/0181989 A1 * | 8/2007 | Corisis et al. | 257/686 |
| 2008/0017968 A1 * | 1/2008 | Choi et al. | 257/686 |
| 2008/0083988 A1 * | 4/2008 | Lin | 257/738 |
| 2008/0157329 A1 * | 7/2008 | Inoue | 257/686 |
| 2009/0057895 A1 | 3/2009 | Lin et al. | |
| 2009/0127688 A1 * | 5/2009 | Lee et al. | 257/686 |
| 2009/0212412 A1 * | 8/2009 | Yoon | 257/690 |
| 2009/0261466 A1 * | 10/2009 | Pagaila et al. | 257/686 |
| 2009/0309224 A1 | 12/2009 | Lin et al. | |
| 2009/0322437 A1 | 12/2009 | Avni et al. | |
| 2010/0072600 A1 | 3/2010 | Gerber | |
| 2010/0090323 A1 | 4/2010 | Shinoda et al. | |
| 2010/0117212 A1 * | 5/2010 | Corisis et al. | 257/686 |
| 2010/0148316 A1 * | 6/2010 | Kim et al. | 257/621 |
| 2010/0244216 A1 * | 9/2010 | Huang et al. | 257/686 |
| 2010/0244263 A1 | 9/2010 | Lin et al. | |
| 2011/0024905 A1 | 2/2011 | Lin et al. | |
| 2011/0032400 A1 | 2/2011 | Yang | |
| 2011/0156230 A1 | 6/2011 | Goh | 257/686 |
| 2011/0156240 A1 | 6/2011 | Luan et al. | 257/692 |
| 2011/0157452 A1 | 6/2011 | Goh et al. | 348/340 |
| 2011/0157853 A1 | 6/2011 | Goh | 361/783 |
| 2011/0210413 A1 | 9/2011 | Huang et al. | |
| 2011/0241055 A1 | 10/2011 | Urasaki et al. | |
| 2011/0260303 A1 * | 10/2011 | Pagaila et al. | 257/660 |
| 2011/0278717 A1 * | 11/2011 | Pagaila et al. | 257/737 |
| 2011/0291274 A1 * | 12/2011 | Meyer et al. | 257/738 |
| 2011/0316146 A1 * | 12/2011 | Pagaila et al. | 257/737 |
| 2011/0316156 A1 * | 12/2011 | Pagaila et al. | 257/738 |
| 2012/0049364 A1 * | 3/2012 | Sutardja et al. | 257/738 |
| 2013/0200528 A1 | 8/2013 | Lin et al. | |

OTHER PUBLICATIONS

Kim-Yong Goh et al, "Fan-Out Wafer Level Package for an Optical Sensor and Method of Manufacture Thereof", U.S. Appl. No. 12/651,304, filed Dec. 31, 2009, 27 pages.

Jing-En Luan et al, "Reliable Large Die Fan-Out Wafer Level Package and Method of Manufacture," U.S. Appl. No. 12/651,362, filed Dec. 31, 2009, 27 pages.

Kim-Yong Goh, "Fan-Out Wafer Level Package With Polymeric Layer for High Reliability" U.S. Appl. No. 12/651,295, filed Dec. 31, 2009, 31 pages.

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.

Jin, "Apparatus and Method for Placing Solder Balls," U.S. Appl. No. 13/340,275, filed Dec. 29, 2011, 31 pages.

Johnson, "STATS ChipPAC Expands eWLB to Reconstituted 300 mm Wafers," *Semiconductor International*, published Apr. 15, 2010, downloaded from http://english.ime.cas.cn/ns/es/201004/t20100429_53569.html, which was published by Microelectronice of Chinese Academy of Sciences, 2007, 2 pages.

ASE Tech Forum, "ASE PoP (TRD PoP & MAP PoP)," The Advanced Semiconductor Engineering Group, Sep. 2007, 37 pages.

Goh, "Fan-Out Wafer Level Package with Polymeric Layer for High Reliability," U.S. Appl. No. 12/649,130, filed Dec. 29, 2009, 30 pages.

* cited by examiner

FLIP-CHIP FAN-OUT WAFER LEVEL PACKAGE FOR PACKAGE-ON-PACKAGE APPLICATIONS, AND METHOD OF MANUFACTURE

BACKGROUND

1. Technical Field

Embodiments of the disclosed invention are directed to a fan-out wafer level package for a semiconductor device, and in particular, to such a device that employs a redistribution layer manufactured on a sacrificial silicon wafer before attachment of semiconductor dice that are to be packaged.

2. Description of the Related Art

For manufacturers of semiconductor devices, there is a continuing desire to increase the density and reduce the size of the devices, so that more devices can be made on a single wafer of semiconductor material, and so that products that incorporate the devices can be made more compact. One response to this desire has been the development of chip scale packaging and wafer level packaging. These are packages that have a footprint that is very close to the actual area of the semiconductor die. They are generally direct surface mountable, using, e.g., ball grid arrays and flip chip configurations.

Another development is the reconfigured wafer, in which a semiconductor wafer is separated into individual dice, which are reformed into a reconfigured wafer, in which the dice are spaced some greater distance apart than on the original wafer, after which additional processing steps are performed on the devices. One benefit is that this provides increased area for each die for "back end" processes, such as the formation of contacts at a scale or pitch that is compatible with circuit board limitations, without sacrificing valuable real estate on the original wafer. Some packages of this type are sometimes referred to as a fan-out wafer level package, because the contact positions of the original die are "fanned out" to a larger foot print. A prior art method of manufacturing a fan-out package 100 is briefly outlined with reference to FIGS. 1-4.

Figure 1:
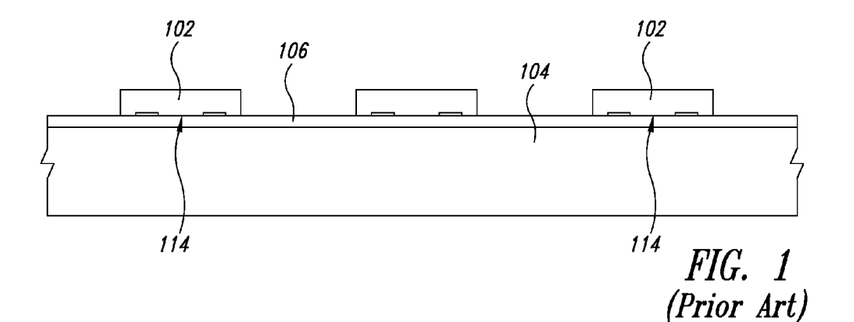
FIGS. 1-4 are diagrammatic cross sections that show a prior art fan-out wafer level package, at various stages of manufacture.
Figure 2:
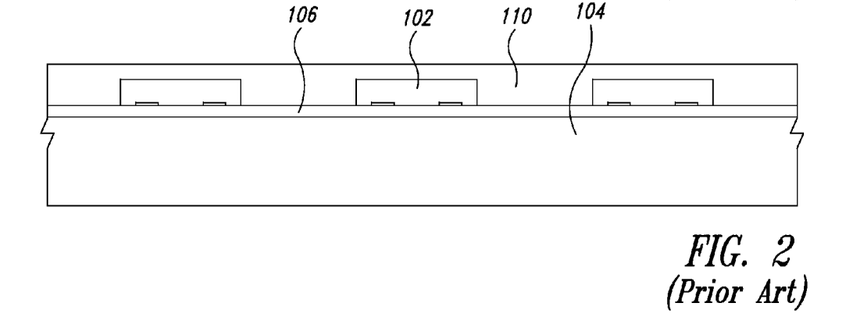

As shown in FIGS. 1 and 2, dice 102 are individually positioned with their active faces 114 facing a laminate carrier strip 104, and held in position by an adhesive tape 106. A liquid molding compound is deposited over the dice 102 and subjected to a compression molding process during which the compound is cured into a hard layer 110. The molding compound is similar to the epoxy material commonly used to form conventional semiconductor packages.

Figure 3:
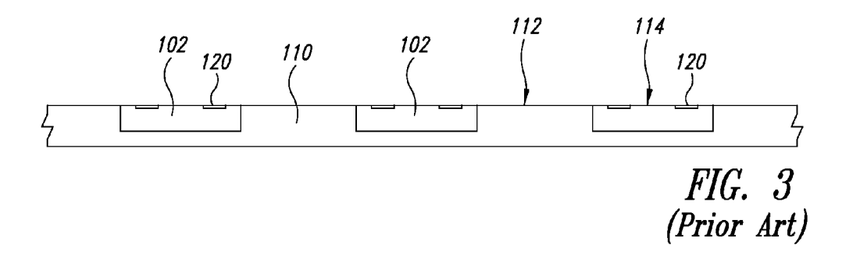
Figure 4:
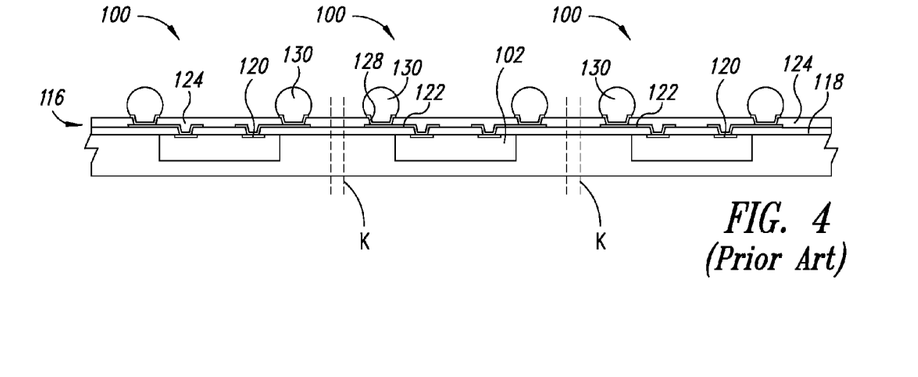

After curing, the laminate carrier strip 104 and tape 106 are removed, leaving the layer 110 with a top surface 112 in which the original dice 102 are embedded with the active faces 114 of the dice exposed for additional connections, as shown in FIG. 3. A redistribution layer 116 is then formed on the layer 110, as shown in FIG. 4. A dielectric layer 118 is deposited over the top surface 112 and patterned to expose contact pads 120 of the original dice 102. A conductive layer is then deposited and patterned to form electrical traces 122. A second dielectric layer 124 is deposited and patterned, and a final conductive layer 126 is deposited and patterned to form redistributed contact pads 128. Solder bumps 130 are formed on the contact pads 128, and the layer 110 is cut at lines K, which define the kerf of the saw, to produce individual fan-out wafer level packages 100.

BRIEF SUMMARY

According to an embodiment, a flip-chip fan-out wafer level package is provided for package-on-package applications, and includes a semiconductor die with solder bumps on an active surface in a flip chip configuration. The die is inverted, with the active surface facing a redistribution layer, and the solder bumps are in electrical contact with respective chip contact pads of the redistribution layer. The redistribution layer includes conductive traces that place each of the solder bumps in electrical contact with one or more contact pads of a plurality of upper redistribution contact pads and a plurality of lower redistribution contact pads, each of the plurality of upper redistribution contact pads has an upper solder ball in electrical contact therewith. The die and the upper solder balls are at least partially encapsulated in an encapsulating layer positioned on the upper surface of the redistribution layer, and whose lateral dimensions are defined by the lateral dimensions of the redistribution layer. A portion of each of the upper solder balls is exposed at a surface of the encapsulating layer for electrical contact with an upper package. Each of the lower redistribution contact pads has a lower solder ball coupled thereto.

According to another embodiment, a method for manufacturing fan-out wafer level packages is provided. According to the method, a redistribution layer is formed on a sacrificial silicon wafer. Semiconductor dice in flip chip configuration are positioned with their active surfaces facing a surface of the redistribution layer, with solder bumps in contact with respective contact pads of the redistribution layer. Additional solder material can be deposited on contact pads on portions of the redistribution layer that extend beyond the edges of the dice. The bumps are reflowed to electrically couple the dice to the redistribution layer, and the solder material is reflowed to form solder balls. An encapsulating material is then deposited onto the wafer and cured, encapsulating the dice and the solder balls in a rigid layer of the material. After the encapsulating material is cured, the sacrificial wafer is removed. A side of the rigid layer opposite the redistribution layer is back-ground to expose a portion of each of the encapsulated solder balls, and additional solder balls are formed on an side of the redistribution layer opposite the dice.

DETAILED DESCRIPTION

Figure 5:
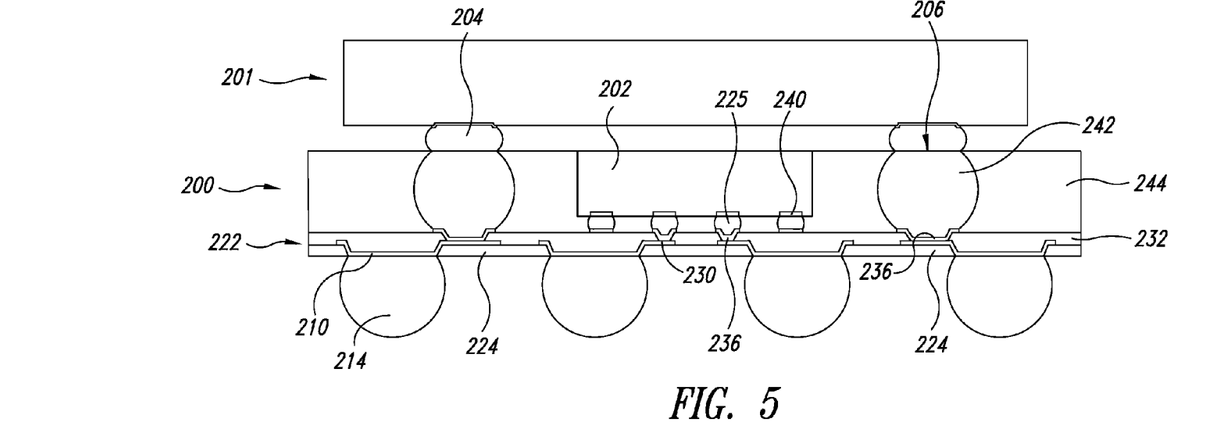
FIG. 5 shows a fan-out wafer level package with a second semiconductor package in a package-on-package configuration, according to an embodiment of the invention.

FIG. 5 shows a fan-out wafer level package 200 with a second semiconductor package 201, which includes a semiconductor device, coupled thereto in a package-on-package configuration, according to an embodiment of the invention. The package 200 includes a semiconductor die 202 encapsulated in a layer 244 of molding compound. A redistribution layer 222 is positioned on the bottom of the package 200, as viewed in FIG. 5, and includes a first and second dielectric layers 224, 232, and first and second pluralities of contact pads 210, 236, as well as conductive traces 230. Connectors 225 couple contact pads 240 of the die 202 to respective ones of the first plurality of contact pads 236. A first plurality of solder balls 242 is formed on respective ones of the second plurality of contact pads 236, and a second plurality of solder balls 214 is formed on respective ones of the first plurality of contact pads 210. Each of the first plurality of solder balls 242 has a planar upper face that is exposed at the upper surface of the package 200, and that functions as one of a third plurality of contact pads 206 for connection to contact pads of the second package 201 by solder joints 204. A process for manufacturing the package 200 is described hereafter with reference to FIGS. 8-14.

Figure 6:
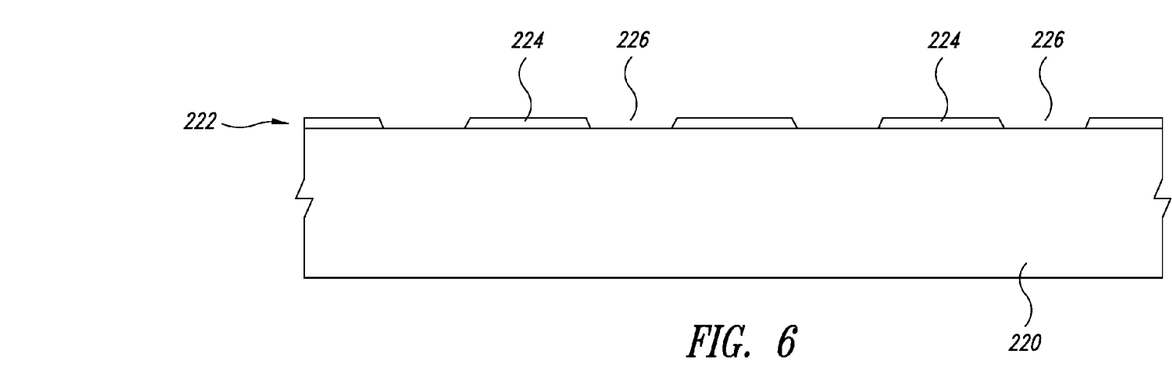
FIGS. 6-12 show the package of FIG. 5 at succeeding stages of manufacture, all shown as diagrammatic cross sections except FIG. 10, which shows a perspective view of a sacrificial wafer employed in the manufacturing process.
Figure 7:
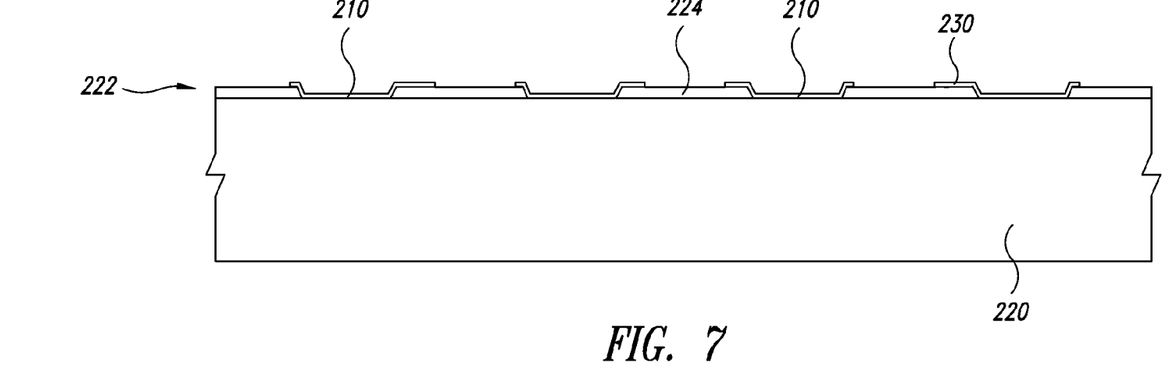
Figure 8:
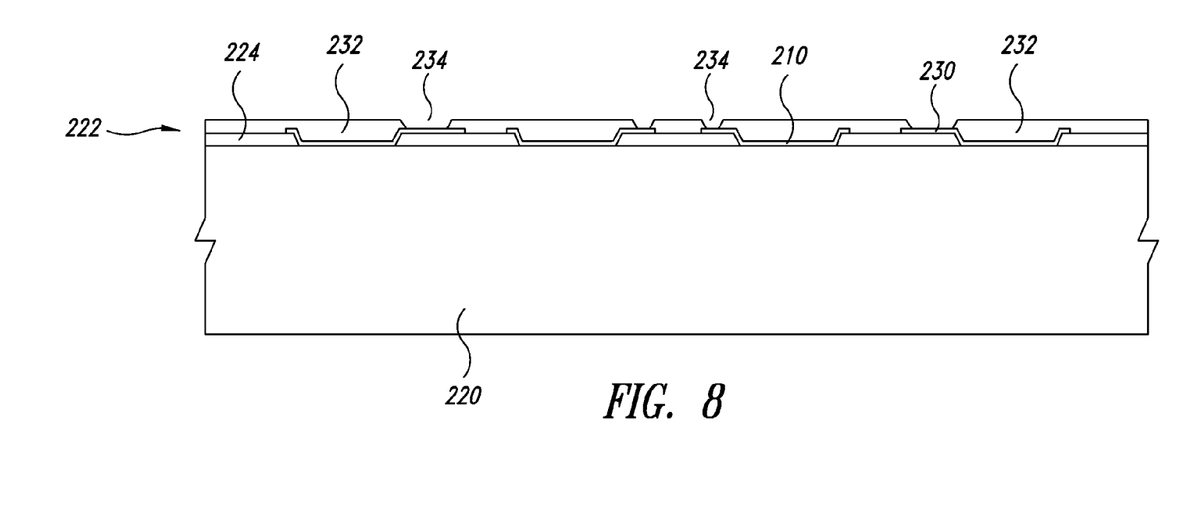

According to an embodiment of the invention, the redistribution layer 222 is first formed on the surface of a sacrificial silicon wafer 220, separate from the die, which is later coupled to the redistribution layer. FIGS. 8-11 show respective stages of the formation of the redistribution layer 222 on sacrificial silicon wafer 220. First, as shown in FIG. 6, the first dielectric layer 224 is deposited on a surface of the wafer 220 and patterned, to form a first plurality of contact apertures 226. FIG. 7 shows a first conductive layer that is deposited over the first dielectric layer 224, and patterned to form the first plurality of contact pads 210 in respective ones of the contact apertures 226, and electrical traces 230 extending over the first dielectric layer 224. FIG. 8 shows the second dielectric layer 232 formed over the first conductive layer, patterned to form a second plurality of contact apertures 234.

Figure 9:
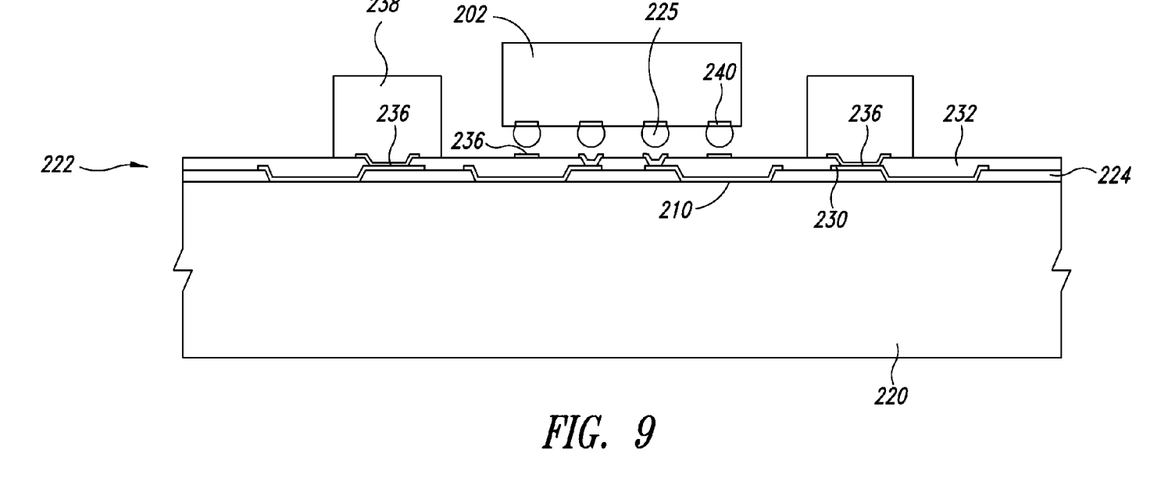

As shown in FIG. 9, a second conductive layer is formed over the second dielectric layer 232, and patterned to form the second plurality of contact pads 236, to complete the redistribution layer 222. Also shown in FIG. 9, portions of solder paste 238 are deposited over selected ones of the second plurality of contact pads 236, and a plurality of semiconductor dice 202—including the die 202 shown in FIGS. 7, 11, 13, and 14—are positioned with their top surfaces facing the redistribution layer 222, and lowered until flip chip connectors 225 make contact with respective ones of the third plurality of contact pads 236. In FIG. 9, the connectors 225 are shown as solder bumps, which are formed on the contact pads 240 of the die 202. With the connectors 225 in contact with respective ones of the second plurality of contact pads 236, the connectors are heated and reflowed to electrically couple contact pads 240 of the semiconductor die 202 to respective ones of the second plurality of contact pads 236. Simultaneously, the portions of solder paste 238 are reflowed to form ones of the first plurality of solder balls 242, in electrical contact with others of the second plurality of contact pads 236 (see FIG. 11).

Figure 10:
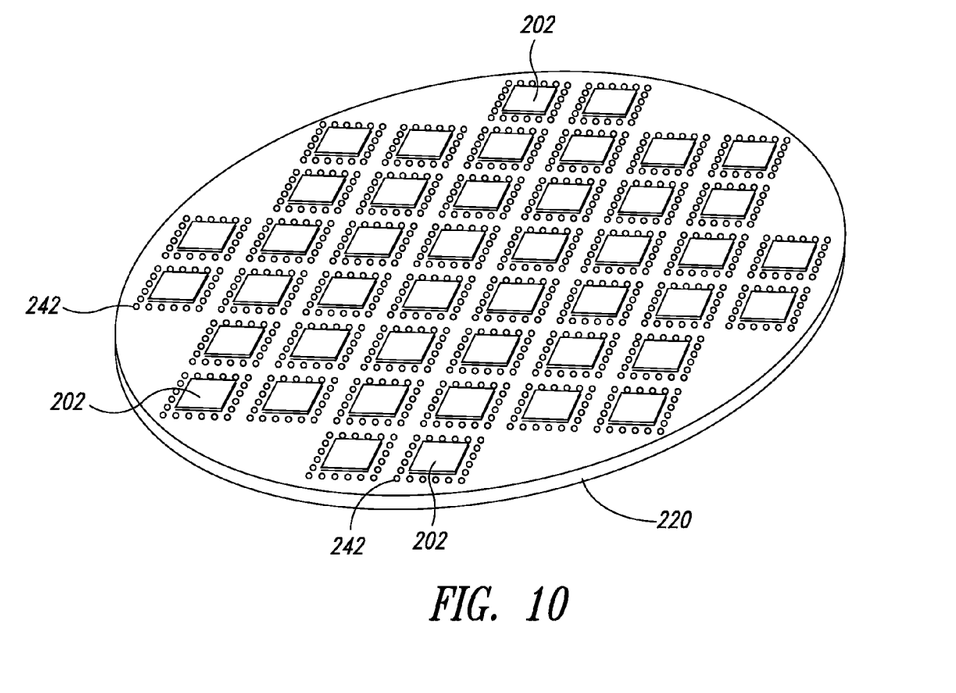

FIG. 10 shows a perspective view of the sacrificial wafer 220 showing the positions of the dice 202 and the first plurality of solder balls 242.

Figure 11:
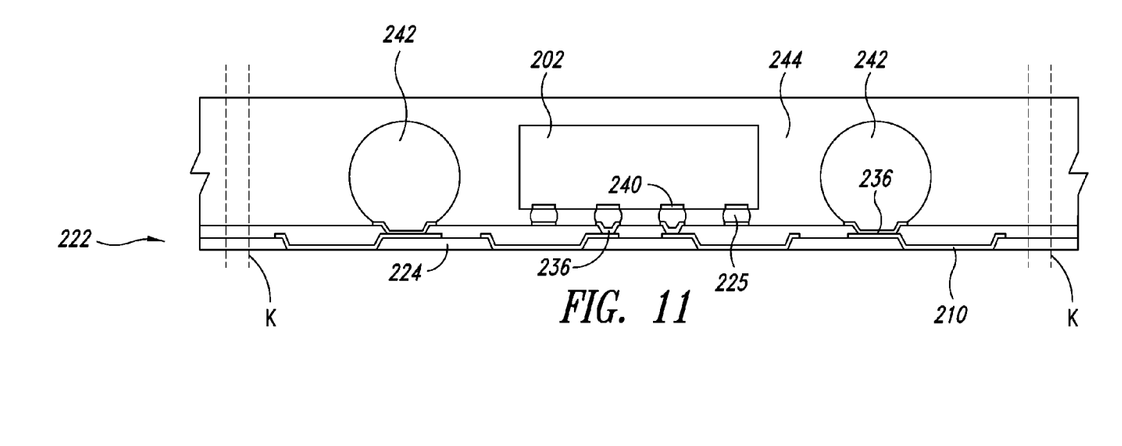

Turning to FIG. 11, after the reflow process discussed above, a molding compound is deposited onto the upper surface of the wafer 220, and subjected to a compression molding process to form the encapsulating layer 244 to encapsulate the semiconductor dice 202 and the first plurality of solder balls 242. After the encapsulating layer 244 is cured, the sacrificial wafer 220 is removed by chemical or mechanical means, exposing the first plurality of contact pads 210 of the redistribution layer 222.

According to an embodiment, an underfill material is placed between each of the dice 202 and the redistribution layer 222 before the molding compound is deposited.

Figure 12:
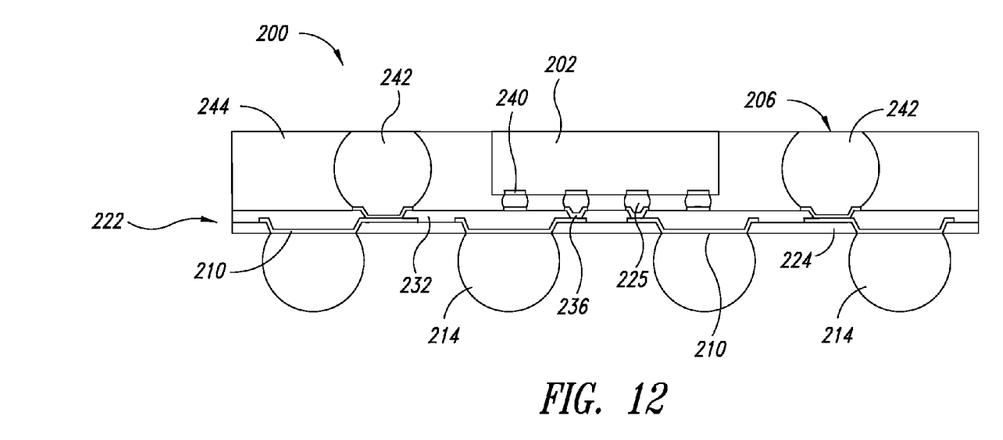

As shown in FIG. 12, after curing, the layer 244 is background to expose an upper portion of each of the second plurality of solder balls 242, which functions as one of the third plurality of contact pads 206 for contact from an upper package, in the manner shown in FIG. 5. Additionally, the second plurality of solder balls 214 is formed on the first plurality of contact pads 210 in a manner similar to that described with reference to the first plurality of solder balls 242. Finally, the wafer 220 is singulated into individual packages 200, at kerf lines K shown in FIG. 11.

Figure 13:
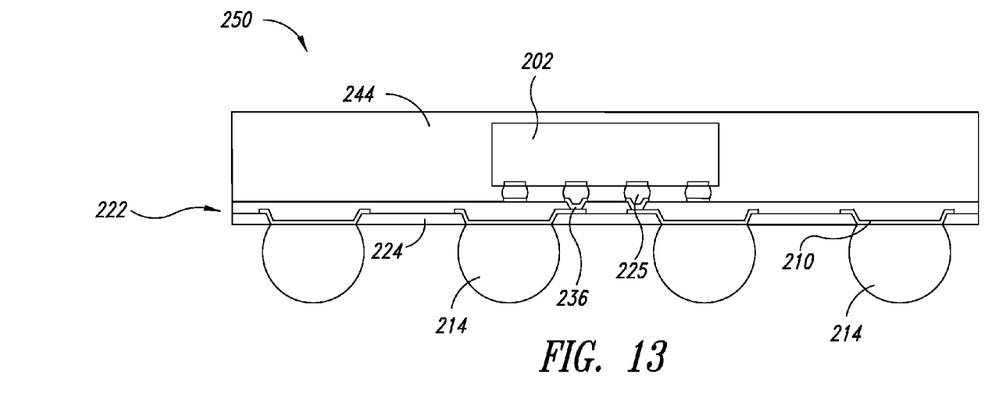
FIG. 13 shows a fan-out wafer level package to an alternate embodiment.

FIG. 13 shows a fan-out wafer level package 250 according to another embodiment. The redistribution layer 223 is made in the same method as shown for the layer 222 in FIGS. 6-10, and thus these steps are not described and shown again. In this embodiment, the first plurality of solder balls 242, shown on the upper surface of the redistribution layer 222 of FIG. 12, and corresponding ones of the second plurality of contact pads 236, are not present in the package 250 of FIG. 13. The package of FIG. 13 is for use in applications where a package-over-package configuration is not required. The embodiment of FIG. 13 also shows the die 202 completely encapsulated in the mold compound, in contrast to the embodiment of FIG. 12, in which the back grind step exposes the back side of the die 202.

The redistribution layer 222 disclosed above is described as comprising first and second dielectric layers and first and second conductive layers. The redistribution layer can include additional layers in order to accommodate a more complex wiring circuit. Alternatively, where not required, the second conductive layer can be omitted. Furthermore, any of the layers can themselves comprise multiple layers. For example, the dielectric layers can include passivation layers, buffer layers, spacing layers, etc., and the conductive layers can include seed layers, plated metallic layers, vapor deposited layers, barrier layers, etc.

Processes for performing the manufacturing steps discussed above are very well known in the art, and are within the abilities of a person having ordinary skill in the art.

Embodiments of the invention provide a number of advantages over the prior art devices described with reference to FIGS. 1-4. First, the per unit cost is significantly reduced. With reference to the prior art devices of FIGS. 1-4, only a limited number of packages can be manufactured on a laminate strip, not only because of the smaller size of the strip, but also because of the difficulties associated with precise positioning of the individual dice on the laminate by reference to relative spacing alone. With larger numbers it becomes increasingly difficult to position them with sufficient accuracy to prevent misregistration of the masks of the redistribution layer. In contrast, the packages of the embodiments disclosed with reference to FIGS. 7-15 are manufactured on a sacrificial silicon wafer, which has a much greater capacity than a laminate strip. Additionally, because the redistribution layer is made before the dice are positioned, the pick-and-place mechanism employed to position the individual dice on the wafer can align each die according to selected features of the redistribution layer, thereby ensuring correct positioning of each die relative to the contact pads of the redistribution layer.

Second, potential warping of the package material is avoided. Many of the processes associated with depositing, masking, and etching the layers of the redistribution layer require elevated temperatures. The molding compound material that is typically used to encapsulate the dice has a coefficient of thermal expansion that is greater than that of silicon. Additionally, the reconfigured strip of devices must be removed from the supporting laminate base before the redistribution layer can be formed. The thermal cycles that occur during the formation of the redistribution layer on the prior art devices can cause the material to warp, which interferes with succeeding process steps. In contrast, with respect to the disclosed embodiments, the redistribution layer is made before the dice are emplaced and the mold compound deposited, so the dice are not present during the formation of the redistribution layer, eliminating the possibility of thermal mismatch, and the redistribution layer is fully supported by the sacrificial silicon wafer during formation, so warping is substantially eliminated.

Third, the disclosed device provides a significant reduction in height as compared to prior art devices. In many prior art devices configured for use in package-on-package configurations, a laminate carrier is employed, to which the lower substrate is attached. No such carrier is required by the devices disclosed herein.

Fourth, with reference to some prior art device, there is a danger of "inter-knocking," in which, when subjected to sharp acceleration, the middle of an upper package can flex slightly and strike against the lower package, which can result is damage to one or both of the devices.

Ordinal numbers, e.g., first, second, third, etc., are used according to conventional claim practice, i.e., for the purpose of clearly distinguishing between claimed elements or features thereof. The use of such numbers does not suggest any other relationship, e.g., order of operation or relative position of such elements. Furthermore, ordinal numbers used in the claims have no specific correspondence to those used in the specification to refer to elements of disclosed embodiments on which those claims read.

The term redistribution layer is sometimes used in the art to refer to a single conductive layer, while at other times it is used so broadly as to refer to any related structure, including support substrates, laminate strips and bases, etc. For the purposes of the present disclosure and claims, redistribution layer is a layer that includes one or more layers of dielectrics and conductors that are formed or deposited on an underlying substrate or layer to create and isolate redistributing signal paths of a semiconductor die, including a die of a reconfigured wafer. Specifically excluded from the definition is any support substrate of the redistribution layer, whatever its composition, including laminate material, glass, silicon, etc.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The following U.S. patent applications, filed concurrently herewith, are directed to subject matter that is related to or has some technical overlap with the subject matter of the present disclosure: MULTI-STACKED SEMICONDUCTOR DICE SCALE PACKAGE STRUCTURE AND METHOD OF MANUFACTURING SAME, by Kim-Yong Goh, attorney docket No. 851663.488; FAN-OUT WAFER LEVEL PACKAGE FOR AN OPTICAL SENSOR AND METHOD OF MANUFACTURE THEREOF, by Kim-Yong Goh and Jing-En Luan, attorney docket No. 851663.493; RELIABLE LARGE FAN-OUT WAFER LEVEL PACKAGE AND METHOD OF MANUFACTURE, by Kim-Yong Goh and Jing-En Luan, attorney docket No. 851663.495; and FAN-OUT WAFER LEVEL PACKAGE WITH POLYMERIC LAYER FOR HIGH RELIABILITY, by Kim-Yong Goh, attorney docket No. 851663.501; each of which is incorporated herein by reference in its entirety.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wafer, comprising:
a rigid redistribution layer on the wafer having a plurality of sections, each section including:
a first plurality of contact pads positioned on a first side of the redistribution layer,
a second plurality of contact pads positioned on a second side of the redistribution layer, and
a plurality of conductive traces, each extending in the redistribution layer and placing two or more of the contact pads of the first and second pluralities of contact pads in electrical communication;
a plurality of semiconductor dice, each of the semiconductor die having a third plurality of contact pads on a first surface, the semiconductor die being positioned with its first surface facing the first side of a respective section of the redistribution layer, with a fan-out portion of the redistribution layer extending beyond the respective semiconductor die in at least one direction parallel to the first side, each fan-out portion of the redistribution layer including a first set of contact pads of the first plurality of contact pads, wherein a second set of contact pads of the first plurality of contact pads is located proximate the semiconductor die, and wherein the first set of contact pads are electrically isolated from the third plurality of contact pads on the first surface of the respective semiconductor die;
a plurality of solder connectors placing each of the third plurality of contact pads of a respective die in electrical communication with a respective one of the second set of the first plurality of contact pads;
a plurality of solder balls coupled to the second plurality of contact pads, respectively, on the fan-out portion of the redistribution layer;
an encapsulating layer positioned on the first side of the redistribution layer and encapsulating side surfaces of the semiconductor die, side surfaces of the plurality of solder balls, and entire side surfaces of the plurality of solder connectors, each of the plurality of solder balls having an upper surface that is coplanar with an upper surface of the encapsulating layer and a second surface of the semiconductor die and
a spacing between each of the semiconductor die indicative of a kerf line for separating the semiconductor die into individual packages.

2. The wafer of claim 1, further comprising a semiconductor package positioned over the upper surface of the encapsulating layer, and having a plurality of contact pads, each having a solder contact placing the respective one of the contact pads of the semiconductor package in electrical communication with a corresponding one of the plurality of solder balls.

3. The wafer of claim 1, further comprising a plurality of solder balls coupled to respective ones of the second plurality of contact pads.

4. The wafer of claim 1, wherein the redistribution layer further includes a first dielectric layer and a second dielectric layer.

5. The wafer of claim 2, wherein the semiconductor package is spaced over and apart from the second surface of the semiconductor die.

6. A device comprising:
- a rigid redistribution layer having a first surface having a first portion with a first set of first contacts pads and a second fan-out portion with a second set of first contact pads;
- a plurality of first and second solder connectors, the plurality of first solder connectors being located on the first set of first contact pads of the redistribution layer, the plurality of second solder connectors being located on the second set of first contact pads of the redistribution layer;
- a semiconductor die having a first surface and a second surface, the first and second surfaces being connected by side surfaces, the first surface of the semiconductor die being positioned on the first portion of the first surface of the redistribution layer, the semiconductor die having a plurality of second contact pads on the first surface and in electrical communication with a respective one of the first set of first contact pads of the redistribution layer via the plurality of first solder connectors, the plurality of second contact pads being electrically isolated from the second set of first contact pads; and
- encapsulating material positioned on the first surface of the redistribution layer and encapsulating side surfaces of the semiconductor die and entire side surfaces of the plurality of first and second solder connectors, each of the plurality of first and second solder connectors, the encapsulating layer, and semiconductor die having a common coplanar surface.

7. The device of claim 6, further comprising a semiconductor package positioned over the upper surface of the encapsulating layer, the semiconductor package having a plurality of contact pads, each having a solder contact placing the respective one of the contact pads of the semiconductor package in electrical communication with a corresponding one of the plurality of second solder connectors.

8. The device of claim 7, wherein the semiconductor package is spaced over and apart from the second surface of the semiconductor die.

\* \* \* \* \*